(12) United States Patent
Barber et al.

(10) Patent No.: US 6,424,218 B1
(45) Date of Patent: Jul. 23, 2002

(54) PROGRAMMABLE DIFFERENTIAL ACTIVE VOLTAGE DIVIDER CIRCUIT

(75) Inventors: Earl J. Barber, Essex Junction, VT (US); Gregg R. Castellucci, Plattsburgh, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/795,599

(22) Filed: Feb. 28, 2001

(51) Int. Cl.[7] ................................................. H03F 3/45
(52) U.S. Cl. ......................................... 330/253; 330/252
(58) Field of Search .............................. 330/9, 252, 253

(56) References Cited

U.S. PATENT DOCUMENTS

| | | |
|---|---|---|
| 5,142,241 A | 8/1992 | Yamamoto et al. |
| 5,221,909 A | 6/1993 | Cole |
| 5,465,072 A * | 11/1995 | Atarodi ....................... 330/254 |
| 5,631,606 A | 5/1997 | Tran |
| 5,703,532 A * | 12/1997 | Shin et al. ................... 330/253 |
| 5,760,647 A | 6/1998 | Miller et al. |
| 5,874,840 A | 2/1999 | Bonaccio |
| 5,936,469 A * | 8/1999 | Alexander et al. .......... 330/253 |
| 5,939,904 A * | 8/1999 | Fetterman et al. ............ 327/67 |
| 5,994,966 A | 11/1999 | Stikvoort |
| 6,084,439 A * | 7/2000 | Sculley ........................ 327/59 |

* cited by examiner

*Primary Examiner*—Robert Pascal
*Assistant Examiner*—Khanh Van Nguyen
(74) *Attorney, Agent, or Firm*—Richard A. Henkler; Bracewell & Patterson, L.L.P.

(57) ABSTRACT

An active voltage divide circuit is disclosed. The voltage divider circuit includes a pair of complementary inputs separated by a common input signal node, a pair of complementary outputs, and a pair of divider circuits coupled between the pair of complementary inputs and the pair of complementary outputs. The pair of divider circuits divide input voltages at the pair of complementary inputs, and produces the divided input voltages appear at the pair of complementary outputs, respectively.

16 Claims, 2 Drawing Sheets

PROGRAMMABLE DIFFERENTIAL ACTIVE VOLTAGE DIVIDER CIRCUIT

BACKGROUND OF THE INVENTION

1. Technical Field

The present invention relates to analog circuits in general, and in particular to voltage divider circuits. Still more particularly, the present invention relates to a programmable differential active voltage divider circuit.

2. Description of the Prior Art

Within an analog circuit design, there is usually a need for a voltage divider circuit to provide an output voltage that is a prescribed fraction of the voltage of an input source. Voltage divider circuits are typically produced by connecting at least two resistors in series, and the output is at the common connecting point of which part of the voltage applied to the serial resistors. As a rule, one end of the serial resistors is connected to an input signal whilst the other end of the serial resistors is connected to a common ground.

Referring now to the drawings and in particular to FIG. 1, there is depicted a schematic diagram of an analog voltage divider circuit according to the prior art. As shown, a voltage divider circuit 10 includes a transistor 11, a transistor 12, a variable resistor 13, and a variable resistor 14 connected serially between a power supply 15 and a current source 15. In addition, voltage divider circuit 10 includes an input 16 along with a complementary input 17 and an output 18 along with a complementary output 19. In this arrangement, transistors 11 and 12 match with one another in a one-to-one ratio. Similarly, variable resistors 13 and 14 match with one another in a one-to-one ratio. Because of such symmetry, the output voltage appearing at outputs 18, 19 tracks changes in the input voltage at inputs 16, 17.

One problem with voltage divider circuit 10 is its limited bandwidth. Thus, it is desirable to provide an improved voltage divider circuit with a higher bandwidth.

SUMMARY OF THE INVENTION

In accordance with a preferred embodiment of the present invention, a voltage divider circuit includes a pair of complementary inputs separated by a common input signal node, a pair of complementary outputs, and a pair of divider circuits coupled between the pair of complementary inputs and the pair of complementary outputs. The pair of divider circuits divide input voltages at the pair of complementary inputs, and produces the divided input voltages appear at the pair of complementary outputs, respectively.

All objects, features, and advantages of the present invention will become apparent in the following detailed written description.

BRIEF DESCRIPTION OF THE DRAWINGS

The invention itself, as well as a preferred mode of use, further objects, and advantages thereof, will best be understood by reference to the following detailed description of an illustrative embodiment when read in conjunction with the accompanying drawings, wherein.

DETAILED DESCRIPTION OF A PREFERRED EMBODIMENT

Figure 2:
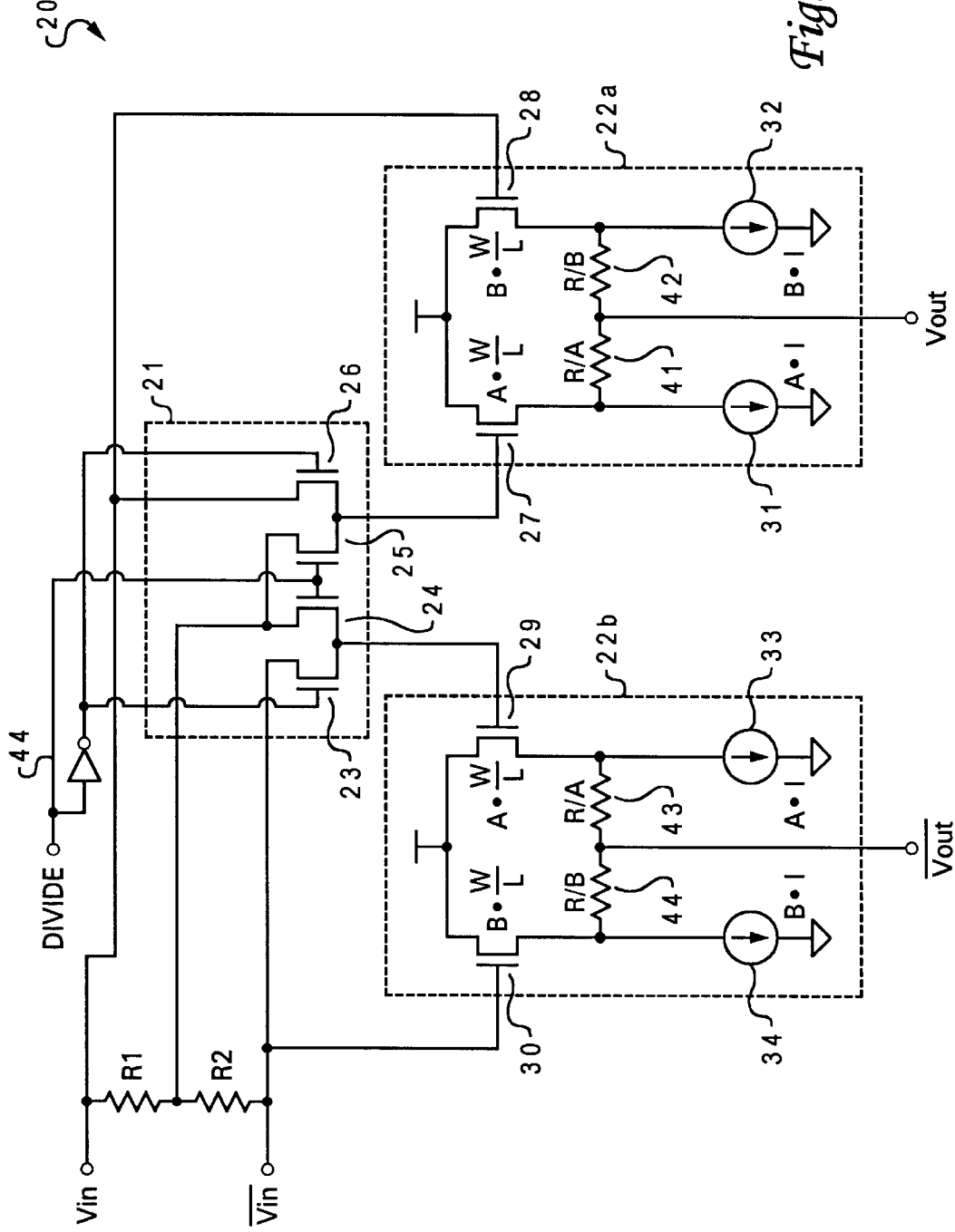
FIG. 2 is a schematic diagram of a voltage divider circuit in accordance with a preferred embodiment of the present invention.

With reference now to FIG. 2, there is illustrated a schematic diagram of a voltage divider circuit in accordance with a preferred embodiment of the present invention. As shown, a voltage divider circuit 20 includes a multiplexor 21, a divider circuit 22a, and a divider circuit 22b. Multiplexor 21 includes four N-channel transistors 23–26. Divider circuit 22a includes two N-channel transistors 27–28, two resistors 41–42, and two current sources 31–32. The values of resistors 41, 42 are R/A and R/B, respectively, where R is a resistance value, A and B are divisors. Furthermore, A and B are integers that can be programmable by either hardware or software. Both the lengths and widths of transistors 27 and 28 can be scaled in relation to the A and B of resistors 41, 42, respectively. For example, if A equals B, the lengths of transistors 27 and 28 will be identical to each other, and the widths of transistors 27 and 28 will be identical to each other.

Similarly, divider circuit 22b includes two N-channel transistors 29–30, two resistors 43–44, two current sources 33–34. The values of resistors 43, 44 are R/A and R/B, respectively, where R is a resistance value, A and B are divisors. Both the lengths and widths of transistors 29 and 30 can be scaled in relation to the A and B of resistors 43, 44, respectively. For example, if A equals B, the lengths of transistors 29 and 30 will be identical to each other, and the widths of transistors 29 and 30 will be identical to each other.

Voltage divider circuit 20 further includes two inputs $V_{in}$ and $\overline{V}_{in}$ and two outputs $V_{out}$ and $\overline{V}_{out}$. Identical resistors R1, R2 are connected between inputs $V_{in}$ and $\overline{V}_{in}$. The values of resistors R1, R2 are preferably very high, such as in the order of megaohms, in order to provide complete voltage isolation between inputs $V_{in}$ and $\overline{V}_{in}$ as to not attenuate input signals at inputs $V_{in}$ and $\overline{V}_{in}$. The node between resistors R1 and R2 is a common input signal ground node.

There are two modes of operations for voltage divider circuit 20. The first mode of operation is no-divide mode, and the second mode of operation is divide mode. The no-divide mode is enabled by de-asserting a divide input 44 to allow input voltages at inputs $V_{in}$ and $\overline{V}_{in}$ to directly appear at gates of transistors 27, 28, 29, 30 in circuits 22a and 22b, respectively. With the same signal at both gates, the circuit behaves as a normal source follower. The divide mode is enabled by asserting divide input 44 to allow divider circuits 22a and 22b to act upon input voltages at inputs $V_{in}$ and $\overline{V}_{in}$ before the voltages appear at outputs $V_{out}$ and $\overline{V}_{out}$, respectively.

Figure 1:
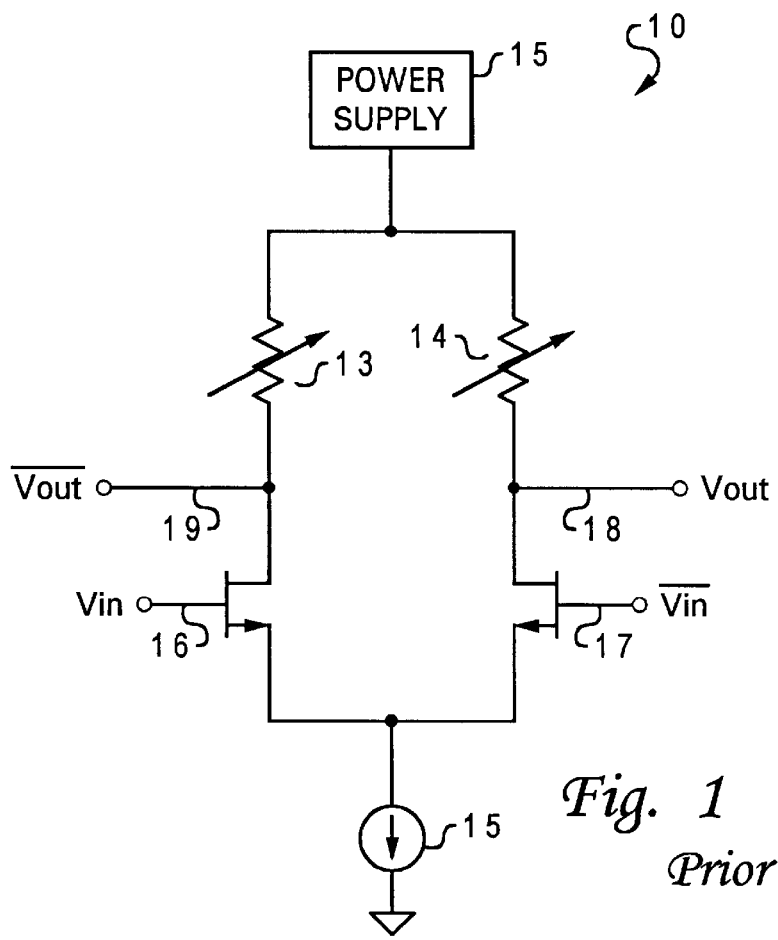
FIG. 1 is a schematic diagram of a voltage divider circuit according to the prior art.
Figure 3:
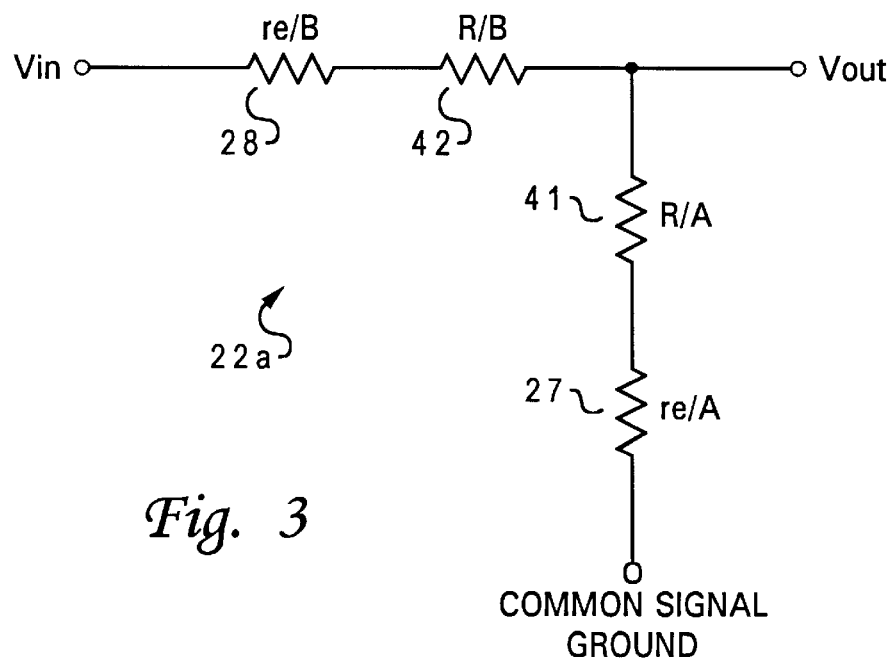
FIG. 3 is a small signal model diagram of a divider circuit within the voltage divider circuit from FIG. 2, in accordance with the preferred embodiment of the present invention.

The action of divider circuits 22a and 22b on input voltages at inputs $V_{in}$ and $\overline{V}_{in}$, can be better illustrated via a small signal model diagram. Referring now to FIG. 3, there is illustrated a small signal model diagram of divider circuit 22a, in accordance with a preferred embodiment of the present invention. As shown, transistor 27 and transistor 28 from FIG. 2 are represented by resistor $r_c/A$ and resistor $r_c/B$, respectively. Resistor $r_c/B$ and resistor R/B (i.e., resistor 42) are connected in series between input $V_{in}$ and output $V_{out}$. Resistor $r_c/A$ and resistor R/A (i.e., resistor 41) are connected in series between $V_{out}$ and a common input signal ground. Under the notation of small signal model of transistors, $r_c$ is equal to $1/G_m$, where $G_m$ is the transconductance of a transistor.

As mentioned previously, during the non-divide mode (i.e., when divide input 44 from FIG. 2 is de-asserted), divider circuit 22a can be viewed as a dual-source follower with resistors connected in series with output. Thus, input voltage at input $V_{in}$ directly appears at output $V_{out}$ during the non-divide mode. During the divide mode (i.e., when divide input 44 is asserted), division occurs when the common mode of the input signal is applied to the gate of a transistor in the source follower pair instead of the signal. In this configuration, a voltage division scheme from the signal gate, across the source resistors, and to the common mode gate is developed (AC ground). During the divide mode, voltage divider circuit 22a operates according to the equations as follows:

$$R_1 = \frac{r_e}{A} + \frac{R}{A}$$

$$R_2 = \frac{r_e}{B} + \frac{R}{B}$$

$$V_{out} = V_{in}\left(\frac{R_1}{R_1 + R_2}\right) = V_{in}\left(\frac{B}{B + A}\right)$$

Different combinations of signal divisions can be achieved by adjusting the ratios between A and B. Furthermore, the widths of current sinks 31–34 and transistors 27–30 (from FIG. 2) need to be scaled together in order to ensure the same DC voltages at both transistor sources. The values of width (W), length (L), current (I), and resistance (R) are left to a designer's discretion in order to achieve specified distortion, bandwidth, and power requirements.

As has been described, the present invention provides an improved active voltage divider circuit for dividing differential signals.

While the invention has been particularly shown and described with reference to a preferred embodiment, it will be understood by those skilled in the art that various changes in form and detail may be made therein without departing from the spirit and scope of the invention.

What is claimed is:

1. A voltage divider circuit, comprising:
   a pair of complementary inputs separated by two resistors with a common input signal node located between said two resistors;
   a pair of complementary outputs; and
   a pair of divider circuits, coupled between said pair of complementary inputs and said pair of complementary outputs, for dividing input voltages at said pair of complementary inputs, and producing said divided input voltages appear at said pair of complementary outputs, respectively.

2. The voltage divider circuit of claim 1, wherein each of said divider circuits includes two transistors, two resistors, and two current sources.

3. The voltage divider circuit of claim 2, wherein the ratio of widths and lengths of said two transistors are programmable.

4. The voltage divider circuit of claim 2, wherein the ratio of widths and lengths of said two transistors are scaled in relation to said two resistors.

5. The voltage divider circuit of claim 1, wherein said two resistors are identical.

6. The voltage divider circuit of claim 1, wherein said voltage divider circuit further includes a multiplexor circuit coupled between said pair of complementary inputs and said pair divider circuits.

7. The voltage divider circuit of claim 6, wherein said multiplexor circuit includes four transistors.

8. The voltage divider circuit of claim 6, wherein said multiplexor circuit includes a divide input.

9. A voltage divider circuit, comprising:
   a pair of complementary inputs separated by a common input signal node;
   a pair of complementary outputs; and
   a pair of divider circuits, coupled between said pair of complementary inputs and said pair of complementary outputs, for dividing input voltages at said pair of complementary inputs, and producing said divided input voltages appear at said pair of complementary outputs, respectively, wherein each of said divider circuits includes two transistors connected in parallel, two current sources connected in parallel, and two resistors connected in series to yield one of said complementary outputs.

10. The voltage divider circuit of claim 9, wherein the ratio of widths and lengths of said two transistors are programmable.

11. The voltage divider circuit of claim 9, wherein the ratio of widths and lengths of said two transistors are scaled in relation to said two resistors.

12. The voltage divider circuit of claim 9, wherein said pair of complementary inputs is separated by two resistors.

13. The voltage divider circuit of claim 12, wherein said two resistors are identical.

14. The voltage divider circuit of claim 9, wherein said voltage divider circuit further includes a multiplexor circuit coupled between said pair of complementary inputs and said pair divider circuits.

15. The voltage divider circuit of claim 14, wherein said multiplexor circuit includes four transistors.

16. The voltage divider circuit of claim 14, wherein said multiplexor circuit includes a divide input.

* * * * *